United States Patent
Akiyama

(10) Patent No.: US 7,656,730 B2
(45) Date of Patent: Feb. 2, 2010

(54) SEMICONDUCTOR MEMORY DEVICE WITH A REFERENCE OR DUMMY CELL FOR TESTING

(75) Inventor: Takeshi Akiyama, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 142 days.

(21) Appl. No.: 12/042,184

(22) Filed: Mar. 4, 2008

(65) Prior Publication Data

US 2008/0219070 A1    Sep. 11, 2008

(30) Foreign Application Priority Data

Mar. 6, 2007    (JP) ............................. 2007-056376

(51) Int. Cl.
   *G11C 29/00*    (2006.01)
   *G11C 29/12*    (2006.01)

(52) U.S. Cl. ............... 365/201; 365/210.1; 365/189.07; 365/149

(58) Field of Classification Search ............ None
See application file for complete search history.

(56) References Cited

U.S. PATENT DOCUMENTS

2005/0063213 A1 *  3/2005  Jacob et al. ................. 365/145

FOREIGN PATENT DOCUMENTS

| EP | 0759620 A2 * | 8/1996 |
| EP | 1143457 A2 * | 10/2001 |
| JP | 2004-103119 A | 4/2004 |

* cited by examiner

*Primary Examiner*—Mark A Robinson
*Assistant Examiner*—James G Norman
(74) *Attorney, Agent, or Firm*—Sughrue Mion, PLLC

(57) ABSTRACT

A semiconductor memory device includes: memory cells respectively arranged on intersecting points of a plurality of word lines and a plurality of data lines, and respectively having a capacitor for storing data; a sense amplifier provided in between the data lines forming a data line pair so as to amplify an electric potential difference between the data lines and to perform data reading; and a test memory cell arranged on each of the data lines and having a test capacitor with a capacitance value set smaller than the above capacitor, and when performing a test for a memory cell, inversed data of the data to be stored into a target memory cell of a test target is pre-written into the test memory cell.

5 Claims, 5 Drawing Sheets

US 7,656,730 B2

SEMICONDUCTOR MEMORY DEVICE WITH A REFERENCE OR DUMMY CELL FOR TESTING

BACKGROUND OF THE INVENTION

1. Field of the Invention

The present invention relates to a semiconductor memory device that has a function for testing a defective cell in memory cells constituting a DRAM (Dynamic Random Access Memory).

Priority is claimed on Japanese Patent Application No. 2007-056376, filed Mar. 6, 2007, the content of which is incorporated herein by reference.

2. Description of Related Art

In recent years, in response to the advancement in the capacity of servers and personal computers, a reduction in the chip size is required in order to achieve a reduction in manufacturing cost and in the size of devices.

Accordingly, in order to meet the above customer requirement, there have been ongoing developments in micro fabrication for chip size reduction, and for improving performance such as processing speed performance.

However, while micro fabrication processes and processing speeds are improving, an increase in defects in memory cells is of concern, and in order to improve the efficiency of a test for detecting defective memory cells, there has been proposed a semiconductor memory device that has a memory cell testing circuit (for example, Patent Document 1).

FIG. 4 shows a configuration example of a sense amplifier and memory cells in a conventional semiconductor memory device. As an example, this circuit diagram of the conventional example shows a semiconductor memory device comprising a sub word driver 210 or a sub word driver 211 provided on each of both sides of a sense amplifier 240, and memory cells connected thereto. The sub word driver 210 corresponds to a memory array 250, and the sub word driver 211 corresponds to a memory array 251. In this circuit diagram of FIG. 4, a sub word line WL1 selected for example by the sub word driver 210 reads a memory cell A, and the data is outputted to a data line DT and amplified in the sense amplifier 240.

Moreover, one of the factors of the above defects in memory cells is that the capacitance value of a capacitance plate (capacitor) Cs of the memory cell is small.

However, in a selection test being currently performed, a memory cell having a capacitor with a lower capacitance value compared to that of a standard range (that is, a defective cell) is likely to pass the test with a high possibility.

In order to detect a defect of a small capacitance value of a capacitor, currently a non standard accelerated test is performed to make a capacitance plate with a low capacitance value defective.

[Patent Document 1] Japanese Unexamined Patent Application, First Publication No. 2004-103119

However, as can be seen from the waveform diagram of the conventional word line and data lines shown in FIG. 5, there is a problem in that in a current memory cell structure, even for a memory cell formed with a capacitance value Cs that is smaller compared to that of the design standard range as with the defective cell A which is the detection target of the present invention, if the memory cell has a certain level of capacitance value, the sense amplifier amplifies a minute voltage difference between data lines, and thereby the memory cell passes the selection test and it is not detected as a defective cell.

Furthermore, in a memory cell having a sufficient retention time in a refreshing cycle (having a potential performance of tREF), there is a shortcoming in that it is more difficult to detect a defect.

Therefore, in the conventional technique, as mentioned above, acceleration of the internal power supply voltage, and the tREF value are set much longer than those in the product standard, creating a situation where an unreasonable design needs to be made, and there is also a problem of an overkill in acceleration tests. The possibility of fabricating defective cells will also increase with the future growth in the capacity of memory devices.

SUMMARY OF THE INVENTION

An object of the present invention is to provide a semiconductor memory device having a testing function that detects a defective memory cell formed with a capacitance value of a capacitor in the memory cell that is lower than that of the standard range.

A semiconductor memory device of the present invention has memory cells, a sense amplifier, and a test memory cell. The memory cells are respectively arranged on intersecting points of a plurality of word lines and a plurality of data lines, and respectively have a capacitor for storing data. The sense amplifier is provided in between the data lines forming a data line pair, so as to amplify the electric potential difference between the data lines (between the data lines forming the data line pair) and to perform data reading. The test memory cell is arranged on each of the data lines and has a test capacitor with a capacitance value set smaller than that of the above capacitor. When performing a memory cell test, inversed data of the data to be stored into a target memory cell of a test target is pre-written into the test memory cell.

The semiconductor memory device of the present invention further can have a test word line driver. The test word line driver activates a test word line that selects the test memory cell arranged on the data line to which the target memory cell is connected so as to correspond to a word line selection of the target memory cell, when performing a capacitor capacitance value test for the target memory cell.

The semiconductor memory device of the present invention further can have a control section. The control section stops a selection operation of a row decoder that activates the word line of the memory cell, when writing data into the test memory cell.

The test capacitor can be set so as to have a capacitance value of a capacitor to be detected as a defective cell.

The semiconductor memory device of the present invention can be that in order to perform a capacitor capacitance value test for the target memory cell, then when the target memory cell and the test memory cell that corresponds to the target memory cell are read at the same time, the target memory cell is determined as a normal memory cell if the sense amplifier has outputted data stored in the target memory cell, and on the other hand, the target memory cell is determined as a defective memory cell if the sense amplifier has outputted data stored in the test memory cell.

As described above, according to the present invention, the capacitance value Cs of the test capacitor of the test memory cell is pre-set to a capacitance value of a capacitor to be detected as a defective cell, so as to be smaller than the capacitance value of the capacitor of the memory cell. Then when performing a capacitance test for the capacitor in the memory cell, inversed data of each other is written into the target memory cell of the test target and into the test memory cell, and by performing a processing of data reading from the test memory cell at the same time of reading data from the target memory cell, both data are made to collide with each other in the data line. Then by detecting which one of the electric charge amount in the capacitor and the electric charge amount in the test capacitor is dominating the electric potential of the data line, that is to say, by detecting which capacitance value is greater, the capacitance value of the capacitor of the target memory cell is detected.

As a result, according to the present invention, as described above, the electric potential of the data line is determined according to the difference between the amounts of electric charges respectively accumulated in the target memory cell and the test memory cell, and accordingly it becomes possible to detect the target memory cell having a capacitor with a capacitance value lower than that of the test capacitor of the test memory cell as a defective cell. Therefore, it is no longer necessary to make an unreasonable design by performing internal power supply acceleration as has been conventionally practiced and an overkill of memory cells is suppressed. As a result, it is no longer necessary to significantly extend a refreshing cycle, and hence it becomes possible to reduce a period of time required for testing.

DETAILED DESCRIPTION OF THE INVENTION

Figure 1:
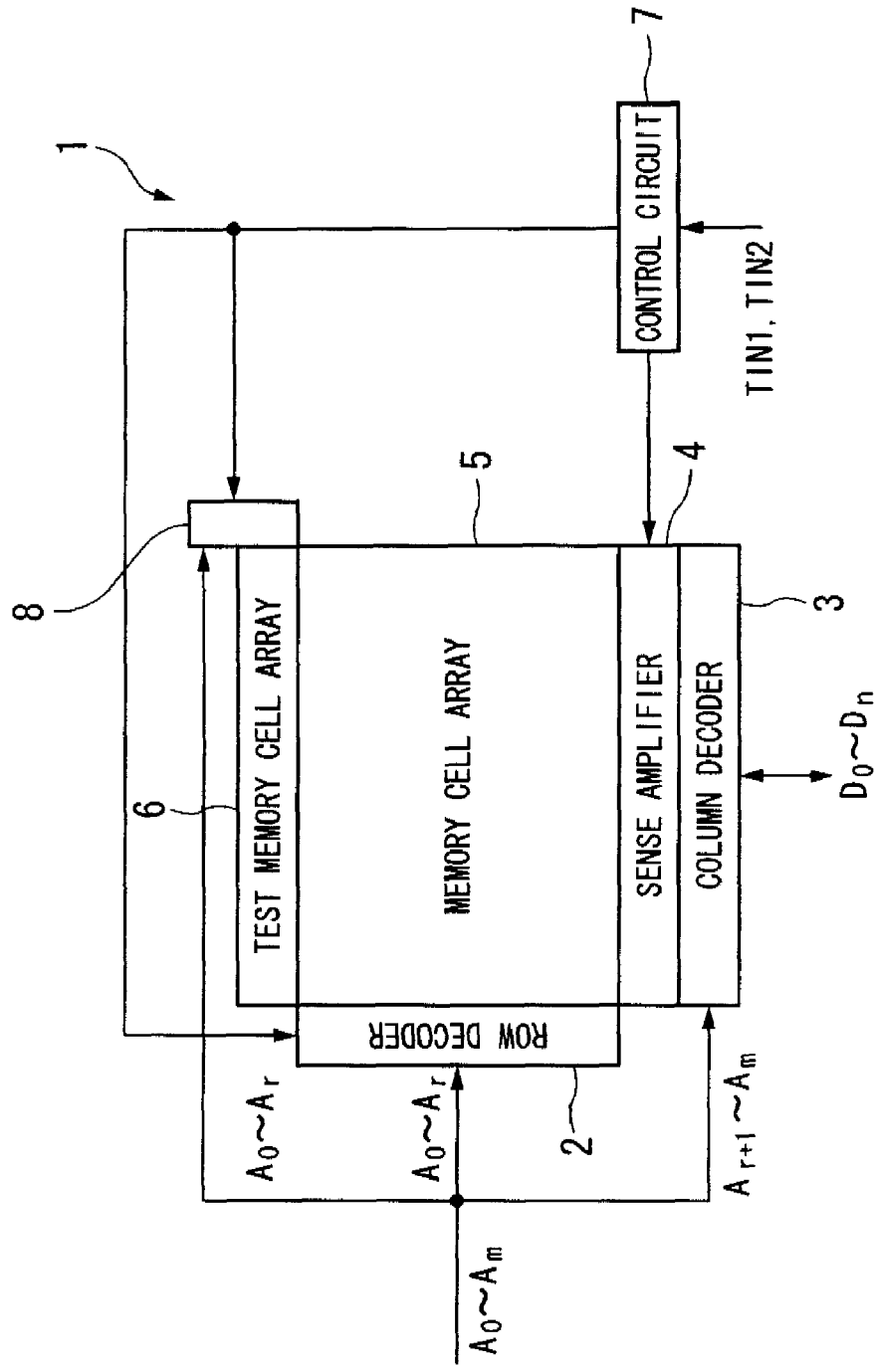
FIG. 1 is a conceptual diagram showing a configuration example of a semiconductor memory device according to an embodiment of the present invention.

Hereinafter, a semiconductor memory device according to an embodiment of the present invention is described, with reference to the drawings. FIG. 1 is a block diagram showing a configuration example of the semiconductor memory device according to the present embodiment.

In this diagram, a semiconductor memory device 1 comprises at least: a row decoder 2; a column decoder 3; a sense amplifier block 4; a memory cell array 5; a test memory cell array 6; a control circuit 7; and a test cell word driver 8.

The memory cell array 5 comprises a plurality of memory cells respectively formed on intersecting points of a plurality of word lines and a plurality of data lines. Here, each memory cell comprises: a capacitor that stores data, that is to say, accumulates an electric charge corresponding to an electric potential; and a MOS (Metal Oxide Semiconductor, an N channel type MOS transistor is used in the present embodiment) transistor that performs switching between data writing into and data reading from the capacitor.

In the row decoder 2, control of the selective operation state and the non selective operation state is performed by the control circuit 7 described later. In the selective operation state, a lower address A0 to Ar of an address A0 to Am (m>r) externally inputted is decoded, and a word line corresponding to the lower address A0 to Ar in the memory cell array 5 is activated (electric potential is raised to an "H" level). Here, the term "selective operation state" refers to a state of performing a selective operation in which an address is inputted, this address is decoded, and a word line indicated by the address is activated (is raised to an "H" level in the present embodiment). Moreover, the term "non selective operation state" refers to a state where: a decoding operation for the inputted address is not performed; no word line is activated (all word lines for output are maintained at an "L" level); and an operation of word line selection is not performed.

The column decoder 3 decodes an upper address Ar+1 to Am of the address A0 to Am externally inputted, and selects a data line corresponding to an upper address Ar+1 to Am in the memory cell array 5.

The sense amplifier block 4 comprises sense amplifiers (sense amplifier 41 described later) respectively provided in between data lines that form combined pairs of respective data lines, and it amplifies a potential difference between the data lines and outputs an amplification result as data.

Accordingly, by having the column decoder 3 select the data line showing an upper address Ar+1 to Am among the data lines, for which the potential differences have been amplified by the respective sense amplifiers of the sense amplifier block 4, it becomes possible to read data (the electric charge accumulated in the capacitor) stored in a memory cell that corresponds to the externally inputted address A0 to Am.

The test memory cell array 6 comprises test memory cells respectively provided for each of the data lines for testing the capacitance value of the capacitor of the memory cell. Here, each of the test memory cells comprises a test capacitor, the capacitance of which is smaller, for example approximately 25% or 50% depending on the product, than the capacitance value of the above capacitor, and a MOS transistor that performs switching between data writing into and data reading from this test capacitor. Here, for the above test capacitor, a capacitance value with which a writing error and a reading error do not occur in practical use of a semiconductor device is found for each product in an experiment, and from the experiment result, a capacitance value of a capacitor that needs to be detected as a defective cell is set.

Moreover, in this test memory cell, when testing the capacitance value of the capacitor in the memory cell, data of an inversed value of the data to be written is written into a target memory cell, which is a test target memory cell. That is to say, "0" is written into the target memory cell when writing "1" and "1" is written into the target memory cell when writing "0".

Having externally received an input of a test mode signal TIN1 that instructs to test the capacitance value of the capacitor in the memory cell, the control circuit 7 switches into a mode for writing data into the test memory cell of the test memory cell array.

Moreover, having externally received an input of a test mode signal TIN2 that instructs to test the capacitance value of the capacitor in the memory cell, the control circuit 7 switches into a mode for reading data from the test memory cell of the test memory cell array.

Furthermore, in the case where the test mode signal TIN1 or TIN2 is not inputted, the control circuit 7 performs processing for normal data writing and reading in response to the access to the memory cell.

That is to say, with test mode signals TIN1 and TIN2, the control circuit 7 performs control of the respective sense amplifiers of the test cell word driver 8, the row decoder 2, and the sense amplifier block 4.

Having received an input of a test mode signal TIN1, the control circuit 7 brings the row decoder 2 into the non selective operation state so that data is not written into the target memory cell, in order to write data into the test memory cell that is connected to the same data line to which the target memory cell for the capacitance test is also connected, thereby performing a control to not start the word line of any memory cells even if an address is inputted.

Also, at this time, in order to start and activate a test cell word line that selects a test memory cell, the control circuit 7 brings the test cell word driver 8 into the selective operation state.

When the test cell word driver 8 has been brought into the selective operation state by the control circuit 7, an upper address the same as that of the column decoder 3 has been inputted. Therefore, a test word line that selects the test memory cell arranged in the data line to which the above target memory is connected is started at an address that indicates the data line shown by this inputted upper address (MOS transistor in the test memory cell is brought into the ON state).

That is to say, according to the upper address at which a data line in the address where the target memory cell is selected is selected, the test cell word driver 8 activates the test word line to access the test memory cell corresponding to the target memory cell.

According to the above mentioned processing, data of an inversed value of data to be written to the target memory cell is written into the test memory cell that is connected to the same data line to which the target memory cell is also connected.

Furthermore, having received an input of a test mode signal TIN2, the test cell word driver 8 is brought into the selective operation state while the row decoder 2 is maintained in the selective operation state.

As a result, the row decoder 2 activates a word line that corresponds to the inputted lower address, and the column decoder 3 selects a data line that corresponds to the upper address. Accordingly, the target memory cell indicated by the inputted address is selected, and the test cell word driver 8 activates a test word line that selects the test memory cell connected to the same data line to which this target memory cell is connected. Therefore, with respect to the same data line, data in the target memory cell and data in the test memory cell are read.

For example, after inputting the above test mode signal TIN1 and pre-writing data "0" into the test memory cell, data "1" is written into the target memory cell and the above test mode signal TIN2 is inputted, thereby reading the data in this target memory cell.

As a result, since the data line is (½) VDD after pre-charging, the electric potential of the data line fluctuates according to an amount of electric charges where both of the amount of electric charge accumulated in the capacitor and the amount of electric charge accumulated in the test capacitor are accumulated, and the sense amplifier amplifies a difference between the electric potential of this data line and the electric potential (½) VDD of one of the pair of the data lines, to determine the data in the data line.

Figure 2:
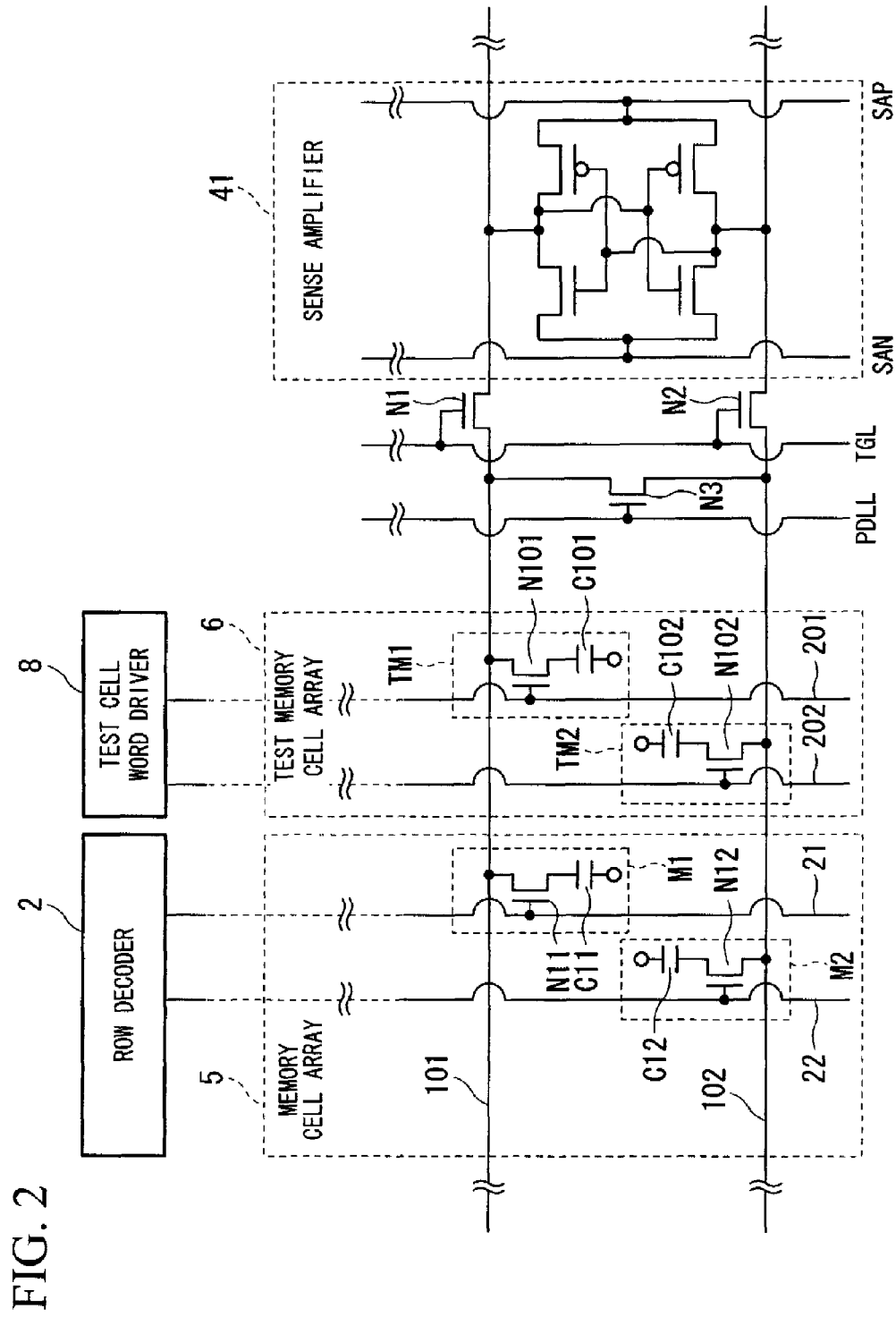
FIG. 2 is a conceptual diagram showing an arrangement of a memory cell and a test memory cell of the semiconductor memory device of FIG. 1 with respect to data lines.

Hereinafter, a configuration of the present embodiment for performing a memory cell capacity test is described, with reference to FIG. 2. FIG. 2 is a detailed diagram that shows a data line pair, memory cells corresponding to this data line pair, test memory cells, and sense amplifiers, taken from FIG. 1.

A data line 101 and a data line 102 form a data line pair, and between these data lines 101 and 102, there is formed a sense amplifier 41. When a signal line SAP is an "H" level and a signal line SAN is an "L" level, the sense amplifier 41 is activated (is brought into a state where an amplifying operation is performed in the sense amplifier). On the other hand, when the signal line SAP is an "L" level and the signal line SAN is an "H" level, the sense amplifier 41 is deactivated (is brought into a state where an amplifying operation is not performed).

Moreover, when the data line pair of the data lines 101 and 102 is selected, a signal line TGL is an "H" level. When the data line pair is not selected, the signal line TGL is an "L" level.

Here, MOS transistors N1 and N2 inserted in between the data lines 101, 102 and the sense amplifier 41 are N channel type transistors with their gates connected to the signal line TGL, and they are brought to the ON state when an "H" level is applied to the gate, and are brought to the OFF state when an "L" level is applied to the gate.

When performing pre-charging prior to data reading and data writing, a signal line PDLL is an "H" level, and when performing data reading and data writing, an "L" level is inputted thereto. Here, a MOS transistor N3 provided in between the pair of data lines is an N channel type transistor with the drain connected to the data line 101, the source connected to the data line 102, and the gate connected to the signal line PDLL.

A memory cell M1 in the memory cell array 5 comprises an N channel type MOS transistor N11 and a capacitor C11. The gate of the MOS transistor N11 is connected to a word line 21, the drain is connected to the data line 101, and the source is connected via the capacitor C11 to the ground.

Similarly, a memory cell M2 in the memory cell array 5 comprises an N channel type MOS transistor N12 and a capacitor C12. The gate of the MOS transistor N12 is connected to a word line 22, the drain is connected to the data line 102, and the source is connected via the capacitor C12 to the ground.

A memory cell TM1 in the test memory cell array 6 comprises an N channel type MOS transistor N101 and a capacitor C101. The gate of the MOS transistor N101 is connected to a word line 201, the drain is connected to the data line 101, and the source is connected via the capacitor C101 to the ground.

Similarly, a memory cell TM2 in the test memory cell array 6 comprises an N channel type MOS transistor N102 and a capacitor C102. The gate of the MOS transistor N102 is connected to a word line 202, the drain is connected to the data line 102, and the source is connected via the capacitor C102 to the ground.

As mentioned above, the test capacitors C101 and C102 are formed with capacitance values smaller than that of the capacitors C11 and C12 (for example approximately 25%). As the capacitance value for these test capacitors C101 and C102, with respect to the capacitance value of the capacitors C11 and C12 as a design value, the capacitance value of the test capacitors 101 and 102 is set as the upper limited for the capacitance value for a capacitor of a defective memory cell that needs to be detected. That is to say, the capacitance value of the test capacitors 101 and 102 is set as a threshold value for detecting a capacitor with a capacitance value below this capacitance value.

When performing a test of the capacitance value of the capacitor (when an input of the test mode signal TIN2 has been received), then as mentioned above, the row decoder 2 brings the word line 21 into an "H" level and activates it and the column decoder 3 selects a data line, while the test cell word driver 8 decodes the upper address inputted to the column decoder 3, and brings the test word line 201 that selects the test memory cell TM1 arranged in the data line to which the target memory cell is connected into an "H" level and activates it.

Figure 3:
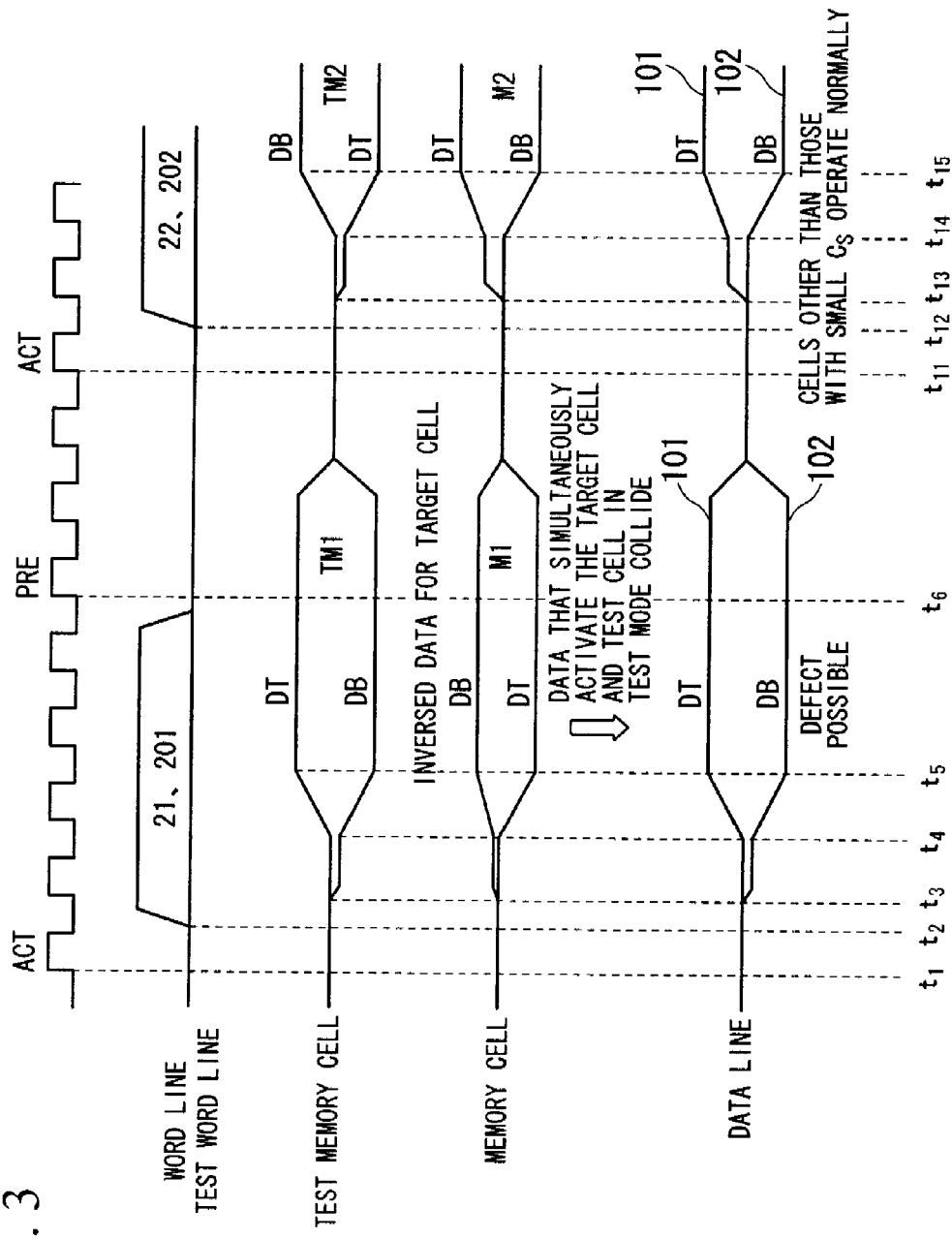
FIG. 3 is a waveform diagram showing waveforms of word lines and data lines observed when testing the capacitance value of a capacitor of the memory cell in FIG. 2.
Figure 4:
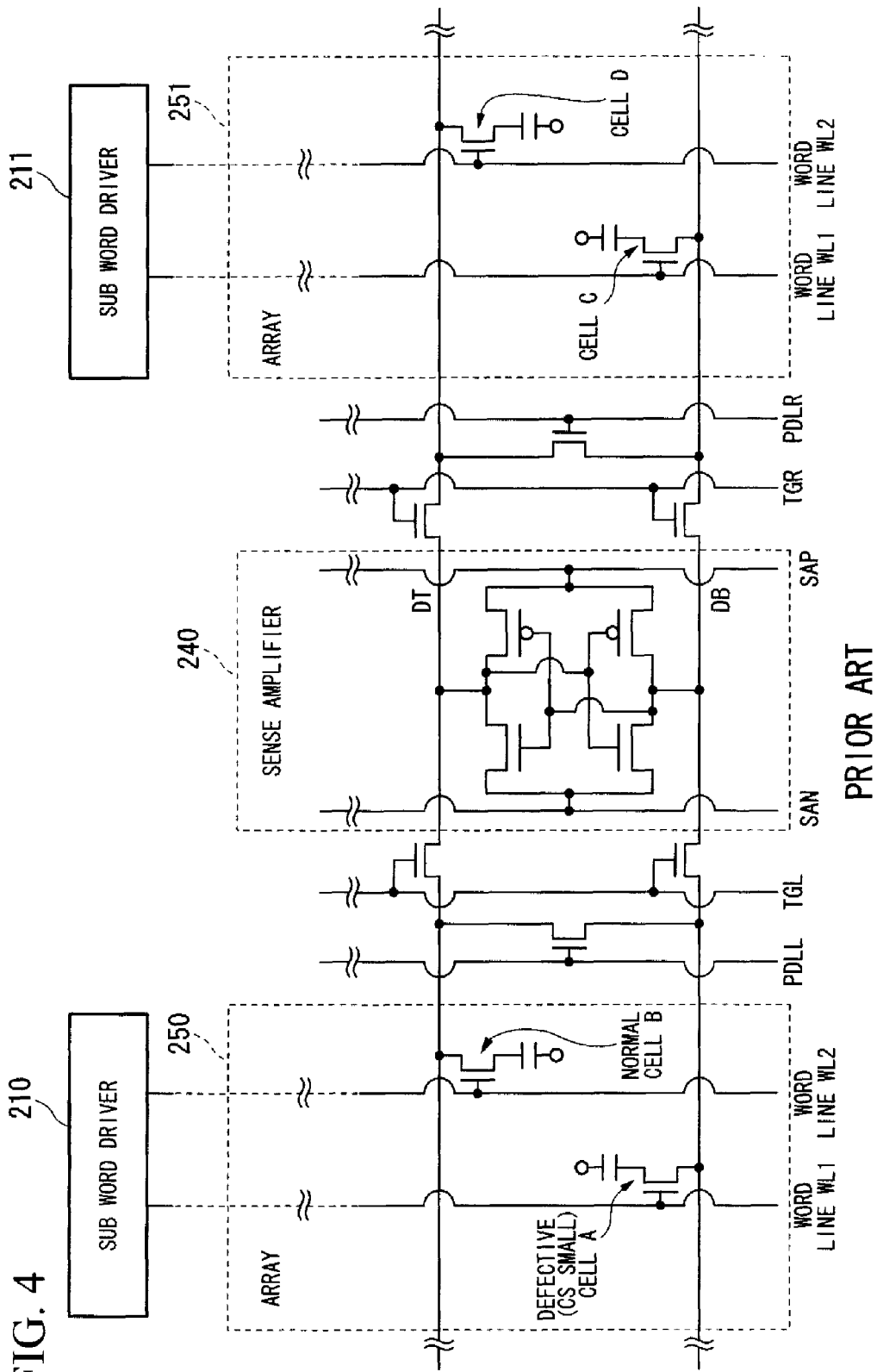
FIG. 4 is a conceptual diagram showing an arrangement of a memory cell of a semiconductor memory device of a conventional example and a test memory cell of the semiconductor memory device of a conventional example, with respect to data lines.
Figure 5:
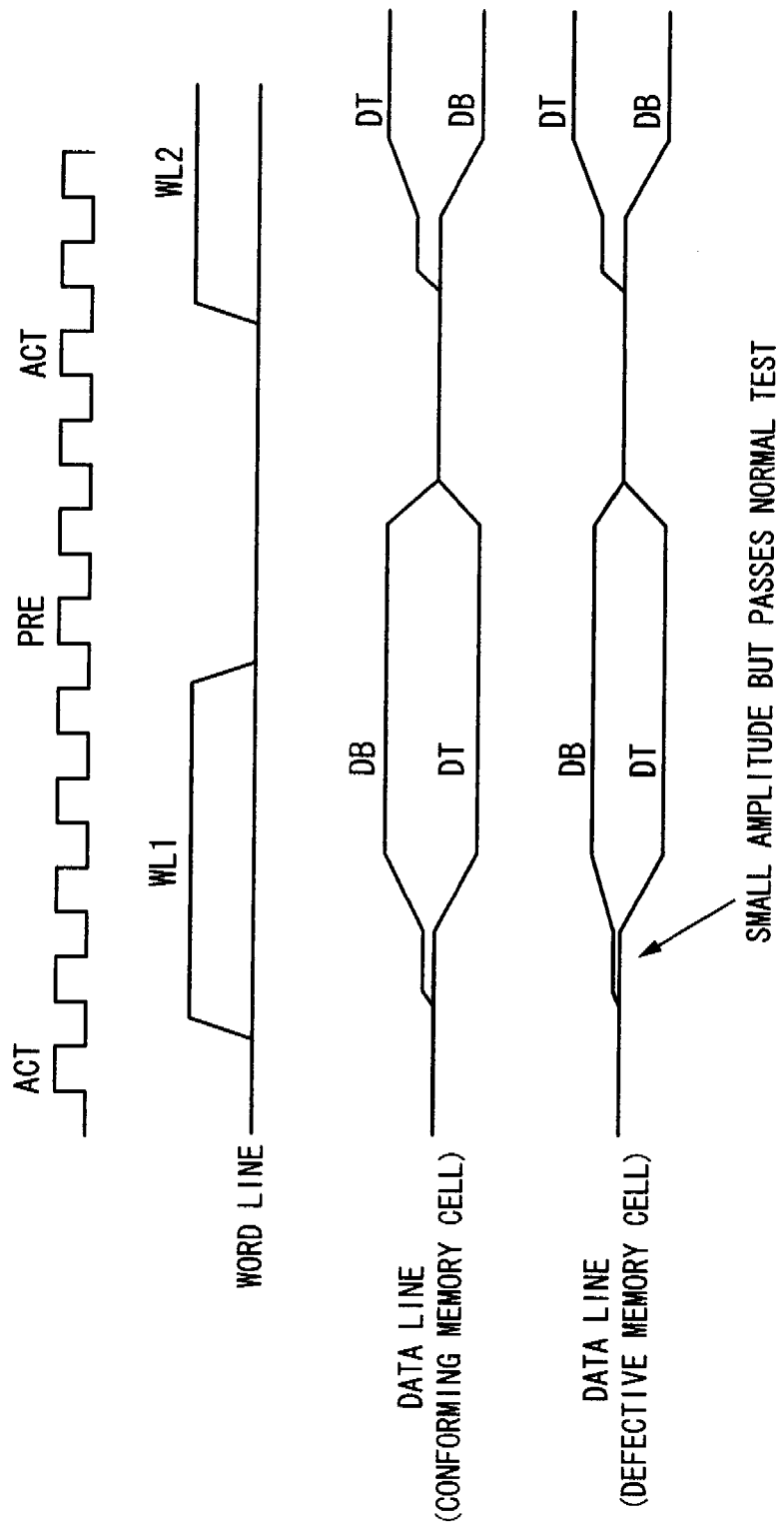
FIG. 5 is a waveform diagram showing waveforms of word lines and data lines observed when testing the capacitance value of a capacitor of the memory cell in FIG. 4.

Next, a flow of a test for the capacitance value of a memory cell in the semiconductor memory device of the present embodiment is described, with reference to FIG. 2 and FIG. 3. FIG. 3 is a waveform diagram showing waveforms of respective signal lines for describing the memory cell M1 corresponding to the word line 21 and the memory cell M2 corresponding to the word line 22 as target memory cells of the test target.

Here, the memory cell M1, for example, is taken as a defective memory cell because the capacitance value of the capacitor C11 for accumulating data is smaller compared with the design standard range. On the other hand, the memory cell M2 is taken as a conforming memory cell becomes the capacitance value of the capacitor C12 for accumulating data is within the design standard range. That is to say, the following is described on the assumption that the capacitance value of the capacitor C11 is smaller than the capacitance value of the test capacitor C101 and the capacitance value of the capacitor C12 is greater than the capacitance value of the test capacitor C102.

Although not shown in the waveform diagram, first as a preprocessing for performing a capacitance value test for a memory cell, data is written into test memory cells connected to the respective data lines.

In order to write data "0" into the memory cells M1 and M2, data "1" that is an inversed data of "0" to be written into the memory cells M1 and M2 is written into the test memory cell TM1 connected to the data line 101, and into the test memory cell TM2 connected to the data line 102.

An address that selects the memory cell M1 is inputted, a test mode signal TIN1 is inputted into the control circuit 7, and a writing instruction is inputted. Thereby, as a preprocessing for data writing to the test memory cell TM1, the control circuit 7 shifts the signal line PDLL from an "L" level to an "H" level and performs pre-charging for the data lines 101 and 102.

Subsequently, the control circuit 7 shifts the signal line PDLL from the "H" level to the "L" level, and completes the pre-charging for the data lines 101 and 102.

At this time, the control circuit 7 brings the row decoder 2 into the non selective operation state, and brings the test cell word driver 8 into the selective operation state.

Having been brought into the selective operation state, the test cell word driver 8 activates and brings the test word line 201 that selects the test memory cell TM1 connected to the data line 101 to which the memory cell M1 indicated by an inputted lower address is connected into an "H" level.

Next, in order to write data into the test memory cell TM1, data "1" is inputted.

Subsequently, the control circuit 7 activates the sense amplifier 41, the inputted data "1" is supplied to the data line 101, data "1" is written into the test capacitor C101, that is to say, electric charge is accumulated, and the source side electric potential of the MOS transistor N101 is brought into close proximity to the power supply voltage VDD.

By performing processing the same as that of the above operation, an address that selects the memory cell M2 is inputted to write data "1" into the test memory cell TM2.

Next, the input of the test mode signal TIN1 into the memory cells M1 and M2 is stopped and a writing instruction is inputted, thereby bringing the processing to the normal writing mode.

As a result, the control circuit 7 maintains the row decoder 2 in the selective operation state, and brings the test cell word driver 8 into the non selective operation state.

Then, having received an input of a pre-charging command, the control circuit 7 shifts the signal line PDLL from the "L" level to the "H" level as a data writing preprocessing, to perform pre-charging for the data lines 101 and 102.

Subsequently, the control circuit 7 shifts the signal line PDLL from the "H" level to the "L" level, and completes the pre-charging for the data lines 101 and 102.

Next, in order to write data into the memory cell M1, an address that selects the memory cell M1 is inputted and data "0" is inputted.

As a result, the row decoder 2 brings the word line 21 that selects the memory cell M1 indicated by the inputted lower address into the "H" level and activates it.

Similarly, the column decoder 3 selects the data line 101 to which the memory cell M1 indicated by the inputted upper address is connected.

Subsequently, the control circuit 7 activates the sense amplifier 41, the inputted data "0" is supplied to the data line 101, data "0" is written into the capacitor C11, that is to say, electric charge is discharged, and the source side electric potential of the MOS transistor N101 is brought into close proximity to the ground potential (Vss or GND).

By performing processing the same as that of the above operation, an address that selects the memory cell M2 is inputted to write data "0" into the memory cell TM2.

Next, in order to perform a test for the capacitance value of the memory cell M1, a test mode signal TIN2 is inputted to the semiconductor memory device 1.

At this time, since the test mode signal TIN2 input has been inputted, the test cell word driver 8 is brought into the selective operation state while the row decoder 2 is maintained in the selective operation state.

Subsequently, having received an input of the pre-charging command prior to time t1, the control circuit 7 shifts the signal line PDLL from the "L" level to the "H" level as a preprocessing of data reading from the memory cell, to perform pre-charging for the data lines 101 and 102.

Then, the control circuit 7 shifts the signal line PDLL from the "H" level to the "L" level, and completes the pre-charging for the data lines 101 and 102.

Next, at time t1, an ACT command, which is a data reading instruction, is inputted to the semiconductor memory device 1.

As a result, at time t2, when a lower address is inputted and the ACT command is inputted, the row decoder 2 brings the word line 21 that selects the memory cell M1 into the "H" level and activates it.

Moreover, the test cell word driver 8, based on the inputted upper address, activates and brings the test word line 201 that selects the test memory cell TM1 connected to the data line 101 to which the memory cell M1 is connected into the "H" level. At this time, the control circuit 7 shifts the signal line TGL from an "L" level to an "H" level.

Moreover, the column decoder 3 selects the data line 101 to which the memory cell M1 indicated by the inputted upper address is connected.

Next, at time t3, due to the difference between the capacitance values of the capacitor C11 of the memory cell M1 and that of the test capacitor C101 of the test memory cell TM1, the electric potential of the data line 101 (DT) gradually becomes higher with respect to the electric potential (½) VDD of the data line 102.

At this time, the capacitance value of the capacitor C11 of the memory cell M1 is smaller compared to that of the test capacitor C101. Therefore, as shown in FIG. 3, the level of the rise in the electric potential of the data line 101 due to the inflow of the electric charge accumulated in the test capacitor C101 into the data line 101 is higher compared to the level of the drop in the electric potential of the data line 101 due to the inflow of the electric charge from the data line 101 into the capacitor C11. As a result, the electric potential of the data line 101 (DT) becomes higher with respect to (½) VDD.

At time t4, the control circuit 7 shifts the signal line SAP from the "L" level to the "H" level, shifts the signal line SAN from the "L" level to the "H" level, and activates the sense amplifier 41.

By so doing, the sense amplifier 41 amplifies the electric potential difference between the data line 101 and the data line 102.

As a result, at time t5, the data line 101 is brought to a voltage close to the power supply voltage VDD, while on the other hand, the data line 102 is brought to a voltage close to the ground electric potential, that is to say, the data line 101 has data "1".

In contrast to the data in the data line 101 being read out and "0" being written in to the memory cell M1, inversed data "1" is read out. Therefore, the memory cell M1 which is the target memory cell, is detected as a defective memory cell.

Next, in the case where an address that selects the memory cell M2 as a target memory cell is inputted, the following processing is performed.

Subsequently, at time t6, having received an input of a pre-charging command, the control circuit 7 shifts the signal line PDLL from the "L" level to the "H" level to perform pre-charging for the data lines 101 and 102.

Then, the control circuit 7 shifts the signal line PDLL from the "H" level to the "L" level, and completes the pre-charging for the data lines 101 and 102.

Next, at time t11, an ACT command, which is a data reading instruction, is inputted to the semiconductor memory device 1.

As a result, at time t12, when a lower address is inputted and the ACT command is inputted, the row decoder 2 brings the word line 22 that selects the memory cell M2 into the "H" level and activates it.

Moreover, the test cell word driver 8, based on the inputted upper address, activates and brings the test word line 202 that selects the test memory cell TM2 connected to the data line 102 to which the memory cell M2 is connected into the "H" level. At this time, the control circuit 7 shifts the signal line TGL from an "L" level to an "H" level.

Moreover, the column decoder 3 selects the data line 102 to which the memory cell M2 indicated by the inputted upper address is connected.

Next, at time t13, due to the difference between the capacitance values of the capacitor C12 of the memory cell M2 and that of the test capacitor C102 of the test memory cell TM2, the electric potential of the data line 101 (DT) gradually becomes higher with respect to the electric potential (½) VDD of the data line 102.

At this time, the capacitance value of the capacitor C12 of the memory cell M2 is greater compared to that of the test capacitor C102. Therefore, as shown in FIG. 3, the level of the rise in the electric potential of the data line 102 due to the inflow of the electric charge accumulated in the test capacitor C102 into the data line 102 is lower compared to the level of the drop in the electric potential of the data line 102 due to the inflow of the electric charge from the data line 102 into the capacitor C12. As a result, the electric potential of the data line 102 (DB) becomes lower compared to that of the data line 101 (DT) (½) VDD.

Then, at time t14, the control circuit 7 shifts the signal line SAP from the "L" level to the "H" level, shifts the signal line SAN from the "L" level to the "H" level, and activates the sense amplifier 41.

By so doing, the sense amplifier 41 amplifies the electric potential difference between the data line 101 and the data line 102.

As a result, at time t15, the data line 101 is brought to a voltage close to the power supply voltage VDD, while on the other hand, the data line 102 (DB) is brought to a voltage close to the ground electric potential, that is to say, the data line 102 has data "0".

In contrast to the data in the data line 102 being read out and "0" being written in to the memory cell M2, inversed data "0" is read out. Therefore, the memory cell M2, which is the target memory cell, is detected as a defective memory cell.

As described above, in the present embodiment, in order to test the capacitance value of the capacitor of the memory cell: a test memory cell having a test capacitor to be compared to the above capacitor is provided; the capacitance value Cs of the capacitor of the target memory cell, which is the test target, is compared to the capacitance value of the test capacitor, which is proportionally smaller than the designed capacitance value of the capacitor (that is to say, the capacitance value of which is set as a threshold value for detecting a defect); the difference in the capacitance values of the capacitor and the test capacitor is amplified by the sense amplifier 41; and it is detected whether or not the capacitance value of the capacitor exceeds the capacitance value of the test capacitor. Thereby, it is determined whether the target memory cell is a conforming product or a defective product.

Consequently, according to the test mode signals TIN1 and TIN2, the processing enters into the capacitance value test mode and a word line for which an ACT command is inputted is selected. Thereby, the test word line that selects the test memory cell connected to the same data line of the sense amplifier to which the word line is connected, is activated at the same time. As a result of pre-writing inversed data into this test memory cell to disturb the target memory cell, two data collide with each other on the same data line.

At this time, the capacitance value Cs of the capacitor of the defective memory cell is smaller compared to that of the test capacitor of the test memory cell. Therefore, it becomes possible to detect even a marginally defective memory cell.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A semiconductor memory device comprising:
    memory cells respectively arranged on intersecting points of a plurality of word lines and a plurality of data lines, and respectively having a capacitor for storing data;
    a sense amplifier provided in between said data lines forming a data line pair, so as to amplify an electric potential difference between said data lines and to perform data reading; and a test memory cell arranged on each of said data lines and having a test capacitor with a capacitance value set smaller than that of said capacitor, wherein when performing a test for said memory cells, inversed data of the data to be stored into a target memory cell of a test target is pre-written into said test memory cell.

2. A semiconductor memory device according to claim 1, further comprising a test word line driver activating a test word line that selects a test memory cell arranged on a data line to which said target memory cell is connected so as to correspond to a word line selection of said target memory cell, when performing a capacitor capacitance value test for said target memory cell.

3. A semiconductor memory device according to claim 2, further comprising a control section stopping a selection operation of a row decoder that activates a word line of said memory cell, when writing data into said test memory cell.

4. A semiconductor memory device according to claim 1, wherein said test capacitor is set so as to have a capacitance value of a capacitor to be detected as a defective cell.

5. A semiconductor memory device according to claim 2, wherein in order to perform said capacitor capacitance value test for said target memory cell, then when said target memory cell and said test memory cell that corresponds to said target memory cell are read at the same time, said target memory cell is determined as a normal memory cell if said sense amplifier has outputted data stored in said target memory cell, and on the other hand, said target memory cell is determined as a defective memory cell if said sense amplifier has outputted data stored in said test memory cell.

* * * * *